(12) United States Patent
Cho et al.

(10) Patent No.: US 9,567,487 B2
(45) Date of Patent: Feb. 14, 2017

(54) COATING COMPOSITIONS COMPRISING POLYORGANO-SILSESQUIOXANE AND A WAVELENGTH CONVERTING AGENT, AND A WAVELENGTH CONVERTING SHEET USING THE SAME

(71) Applicant: KOREA INSTITUTE OF SCIENCE AND TECHNOLOGY, Seoul (KR)

(72) Inventors: So-Hye Cho, Seoul (KR); Seung Sang Hwang, Seoul (KR); Seung Yong Lee, Seoul (KR); Jong-Ku Park, Seoul (KR); Kyung-Youl Baek, Seoul (KR); Albert Sung Soo Lee, Seoul (KR)

(73) Assignee: KOREA INSTITUTE OF SCIENCE AND TECHONLOGY, Seoul (KR)

( * ) Notice: Subject to any disclaimer, the term of this patent is extended or adjusted under 35 U.S.C. 154(b) by 0 days.

(21) Appl. No.: 14/613,789

(22) Filed: Feb. 4, 2015

(65) Prior Publication Data

US 2016/0200939 A1     Jul. 14, 2016

(30) Foreign Application Priority Data

Jan. 8, 2015   (KR) .......................... 10-2015-0002813

(51) Int. Cl.
  *C09D 183/04* (2006.01)
  *C09K 11/06* (2006.01)
  (Continued)

(52) U.S. Cl.
  CPC ............. *C09D 183/04* (2013.01); *C09K 11/06* (2013.01); *C09K 11/623* (2013.01);
  (Continued)

(58) Field of Classification Search
  None
  See application file for complete search history.

(56) References Cited

U.S. PATENT DOCUMENTS 3,294,737 A * 12/1966 Krantz ................... C08G 77/00
                                                              516/199
5,399,648 A *  3/1995 Yamamoto ............. C08G 77/04
                                                              257/E23.077
(Continued)

FOREIGN PATENT DOCUMENTS

EP          2261300 B1   12/2010
JP        08-225648 A    9/1996
(Continued)

OTHER PUBLICATIONS

Korean Office Action dated Jul. 20, 2016; Appln. No. 10-2015-0002813.

*Primary Examiner* — Robert S Loewe
(74) *Attorney, Agent, or Firm* — Ladas & Parry LLP (57) ABSTRACT

The present invention relates to a coating composition having excellent wavelength conversion efficiency and a wavelength converting thin film/sheet prepared using the same. The coating composition of the present disclosure includes 1 to 60 wt % of polyorgano-silsesquioxane, 0.0001 to 30.0 wt % of a wavelength converting agent, and a solvent, and exhibits a transmittance of 70% or more as compared to that of an aqueous solution. A wavelength converting thin film/sheet prepared by using the coating composition has not only excellent photoluminescence, thermal resistance, and light-fastness, but also moisture and oxygen permeability is low, and the visible light transmittance thereof is 70% or more as compared to that of the air, and when patterning is added, the photoluminescence intensity of sheet is at least two-fold higher than that of a non-patterned sheet. Therefore, the coating composition of the present invention may be conveniently used in the (Continued)

preparation of a wavelength converting thin film/sheet, and feasibly applied to the preparation of a solar cell in an efficient manner.

8 Claims, 8 Drawing Sheets (51) Int. Cl.
    *C09K 11/88*     (2006.01)
    *C09K 11/62*     (2006.01)
    *C09K 11/77*     (2006.01)
    *H01L 31/055*     (2014.01)
    *H01L 31/0216*     (2014.01)

(52) U.S. Cl.
    CPC ...... *C09K 11/7728* (2013.01); *C09K 11/7743* (2013.01); *C09K 11/883* (2013.01); *H01L 31/02168* (2013.01); *H01L 31/055* (2013.01); *C09K 2211/1011* (2013.01); *C09K 2211/1029* (2013.01); *C09K 2211/1037* (2013.01); *C09K 2211/1088* (2013.01); *C09K 2211/145* (2013.01); *C09K 2211/1466* (2013.01); *C09K 2211/182* (2013.01); *C09K 2211/188* (2013.01)

(56) References Cited

U.S. PATENT DOCUMENTS

| | | | | |
|---|---|---|---|---|
| 5,600,151 | A * | 2/1997 | Adachi | H01L 21/02126 257/40 |
| 6,340,735 | B1 * | 1/2002 | Yagihashi | C09D 183/04 528/14 |
| 6,600,175 | B1 * | 7/2003 | Baretz | H01L 33/50 257/100 |
| 6,774,202 | B2 * | 8/2004 | Lee | C07F 7/21 525/474 |
| 7,056,989 | B2 * | 6/2006 | Hwang | C08G 77/24 525/474 |
| 2006/0291226 | A1 * | 12/2006 | Daicho | B82Y 20/00 362/509 |
| 2007/0141739 | A1 * | 6/2007 | Thompson | C08J 3/243 438/28 |
| 2008/0131702 | A1 * | 6/2008 | Bae | C08G 59/245 428/418 |
| 2008/0249278 | A1 * | 10/2008 | Kashio | C08G 77/04 528/39 |
| 2009/0005530 | A1 * | 1/2009 | Kashio | C08G 77/04 528/35 |
| 2009/0256171 | A1 * | 10/2009 | Takei | C08L 83/06 257/100 |
| 2009/0272996 | A1 * | 11/2009 | Chakraborty | H01L 33/501 257/98 |
| 2010/0006887 | A1 * | 1/2010 | Takei | C08G 59/24 257/100 |
| 2010/0193831 | A1 * | 8/2010 | Sato | C08G 59/226 257/100 |
| 2011/0251369 | A1 * | 10/2011 | Hwang | C08G 77/26 528/9 |
| 2011/0260139 | A1 * | 10/2011 | Baek | C08G 77/26 257/40 |
| 2013/0062652 | A1 * | 3/2013 | Thompson | B29C 33/0022 257/98 |
| 2013/0068304 | A1 * | 3/2013 | Kanematsu | H01L 31/048 136/259 |
| 2013/0144025 | A1 * | 6/2013 | Hwang | C08G 77/08 528/14 |
| 2013/0285094 | A1 * | 10/2013 | Hsu | H01L 33/50 257/98 |
| 2014/0072812 | A1 * | 3/2014 | Hamada | H01S 5/02296 428/432 |

FOREIGN PATENT DOCUMENTS

| | | |
|---|---|---|
| JP | 2013-069728 A | 4/2013 |
| JP | 2013-182771 A | 9/2013 |
| KR | 10-1068866 B1 | 9/2011 |
| KR | 1020140125143 A | 10/2014 |

\* cited by examiner

COATING COMPOSITIONS COMPRISING POLYORGANO-SILSESQUIOXANE AND A WAVELENGTH CONVERTING AGENT, AND A WAVELENGTH CONVERTING SHEET USING THE SAME

CROSS-REFERENCE TO RELATED APPLICATION

Pursuant to 35 U.S.C. §119(a), this application claims the benefit of earlier filing date and right of priority to Korean Application No. 10-2015-0002813, filed on Jan. 8, 2015, the contents of which is incorporated by reference herein in its entirety.

BACKGROUND OF THE DISCLOSURE

1. Field of the Disclosure

The present disclosure relates to a coating composition having excellent visible light transmittance, durability, and photoluminescence characteristics, and a wavelength converting sheet prepared using the same.

2. Background of the Disclosure

Since polyorgano-silsesquioxane exhibits high transparency, thermal resistance, photodegradation resistance, gas barrier properties, and the like, polyorgano-silsesquioxane per se or a mixture thereof with another polymer material is used as an insulation film, a hard coating agent, a high-hardness film, a photomask, a sealant for a light emitting device, and the like. A ladder-like polyorgano-silsesquioxane has a general structure such as the following Formula 1, and is advantageous in that other characteristics may be imparted according to the type of R-functional group and end group:

<Formula 1>

In a wavelength converting sheet, a matrix material having high transmittance in the ultraviolet, visible, and infrared light regions is required for absorbing only a partial wavelength region from light to convert wavelength and allowing the other wavelength regions to have a high transmittance of 90% or more. In general, examples of a matrix material utilized for the use of wavelength conversion include epoxy (—C—O—C—)-based or silicone (—C—O—Si—C—)-based transparent resins, and other acryl-based, vinyl-based, and carbonate-based transparent polymers. In order to form a coating solution using these resins and polymers, they are mixed with a wavelength converting agent, and the mixture is diluted in a solvent and used.

A wavelength converting sheet may be used as use of converting a wavelength of a light source in a device such as lighting, a self-light emitting diode (LED), and a solar cell (European Patent No. EP 2 261 300 B1; the official gazette of Korean Patent No. 10-1068866B1). In this case, when a wavelength converting sheet is continuously exposed to a light source, and thus a polymer matrix having low heat resistance and low photodegradation resistance is used, deterioration or yellowing is exhibited, and when used for a long time, light converting performance of a wavelength converting agent therein deteriorates, thereby leading to a gradual decrease in the wavelength conversion efficiency.

Therefore, there is an urgent need in the art for a wavelength converting sheet and a preparation method thereof in order to solve the above-described disadvantages.

Throughout the present specification, various patents and publications are referenced and citations are provided in parentheses. The disclosure of these patents and publications in their entities are hereby incorporated by references into this application in order to more fully describe this invention and the state of the art to which this invention pertains.

SUMMARY OF THE DISCLOSURE

The present inventors have done intensive studies to develop a coating composition having a remarkable wavelength conversion efficiency. As a result, the present inventors have confirmed that a coating composition in which at least one wavelength converting agent is mixed with a ladder-like polyorgano-silsesquioxane of Formula 1 at an appropriate ratio (for example, 9:1 to 1:9) not only has an excellent visible light transmittance (for example, 90% or more), but also exhibits a high photoluminescence spectrum when cured, and that when a wavelength converting sheet is prepared using the same, photonic crystals with excellent photoluminescence spectrum may be easily formed, and the effect may be significantly enhanced by further applying patterning, thereby completing the present disclosure.

Therefore, an object of the present disclosure is to provide a coating composition.

Another object of the present disclosure is to provide a method for preparing a wavelength converting sheet.

Still another object of the present disclosure is to provide a wavelength converting sheet prepared according to the above-described method.

Yet another aspect of the present disclosure is to provide a solar cell.

Still yet another object of the present disclosure is to provide a method for preparing a solar cell.

Other objects and advantages of the present disclosure will become apparent from the following detailed description together with the appended claims and drawings.

In one aspect of this invention, there is provided a curable coating composition comprising 1.0 to 60 wt % of polyorgano-silsesquioxane represented by the following Formula 1, 0.0001 to 30 wt % of a wavelength converting agent, and a solvent:

Formula 1 wherein in the Formula 1, $R_1$ and $R_2$ are independently selected from the group consisting of a vinyl group, an aryl group, a methacrylate group, an acrylate group and an epoxy group, and m and n are an integer of 1 to 10,000.

In another aspect of this invention, there is provided a method for preparing a wavelength converting sheet, comprising the steps of: (a) applying the aforementioned coating composition on a substrate; and (b) curing the applied substrate.

In still another aspect of this invention, there is provided a wavelength converting sheet prepared according to the aforementioned method.

The present inventors have done intensive studies to develop a coating composition having a remarkable wavelength conversion efficiency. As a result, the present inventors have confirmed that a coating composition in which at least one wavelength converting agent is mixed with a ladder-like polyorgano-silsesquioxane of Formula 1 at an appropriate ratio (for example, 9:1 to 1:9) not only has an excellent visible light transmittance (for example, 90% or more), but also exhibits a high photoluminescence spectrum when cured, and that when a wavelength converting sheet is prepared using the same, photonic crystals with excellent photoluminescence spectrum may be easily formed, and the effect may be significantly enhanced by further applying patterning.

The ladder-like polyorgano-silsesquioxane (the following Formula 1) exhibits high transparency, thermal resistance, photodegradation resistance, and gas barrier properties, which are close to those of an inorganic material because the inorganic component, a siloxane group (—O—Si—O—), has a ladder-like back-bone structure, and the ladder-like polyorgano-silsesquioxane also exhibits processability which is close to that of an organic polymer because an organic material is included in a functional group (Si—R) linked to silicone (Korean Patent Application No. 10-2013-0042941).

<Formula 1>

When a wavelength converting thin film is prepared using a ladder-like polyorgano-silsesquioxane, the ladder-like polyorgano-silsesquioxane may not only maintain high transmittance and thermal stability until a temperature of 300° C. or more, and but also impart a role to protect a wavelength converting agent from oxidation due to high gas barrier properties, and to stabilize the wavelength converting agent due to an organic functional group or an end group. In particular, in the polyorgano-silsesquioxane structure, it is also possible to impart a function of enhancing a photoluminescence feature by using a functional group (—OH, —NH, —SH, —C=O, —CONH—, —P=O, —P=, and the like) capable of being coordinated to a wavelength converting agent such as metal or a quantum dot, or inducing an end silica Si—OH group to be coordinated to the wavelength converting agent.

The coating composition of the present invention includes a polyorgano-silsesquioxane polymer having a structure of the following Formula 1 and at least one wavelength converting agent:

<Formula 1> in the Formula 1, $R_1$ and $R_2$ are independently selected from the group consisting of a $C_1$-$C_{10}$ straight chain or branched chain alkyl group, a vinyl group, a $C_6$-$C_{10}$ aryl group, a $C_7$-$C_{16}$ aralkyl group, a $C_7$-$C_{16}$ alkaryl group, a $C_3$-$C_{15}$ cycloalkyl group, a $C_4$-$C_{20}$ alkylcycloalkyl group, a methacrylate group, an acrylate group and an epoxy group, and m and n are an integer of 1 to 10,000.

The term "alkyl" used herein means a straight chain or branched chain, unsubstituted or substituted saturated hydrocarbon group, and examples thereof include methyl, ethyl, propyl, isobutyl, pentyl, hexyl, heptyl, octyl, nonyl, decyl, undecyl, tridecyl, pentadecyl, heptadecyl, and the like. The term "$C_1$-$C_{10}$ straight chain or branched chain alkyl" used herein means a straight chain or branched chain alkyl group such as methylamine, ethylamine, n-propylamine, isopropylamine, n-butylamine, sec-butylamine, tert-butylamine, n-amyl, tert-amyl, hexyl, and so on.

The term "aryl" used herein means a fully or partially an unsaturated, substituted or unsubstituted monocyclic or polycyclic carbon ring, and specifically, monoaryl or biaryl. It is preferred that the monoaryl has 5 to 6 carbon atoms, and that the biaryl has 9 to 10 carbon atoms. Practically, the aryl includes substituted or unsubstituted phenyl, benzene, biphenyl, thiophene, and the like, but is not limited to. When a monoaryl, for example, a phenyl is substituted, the monoaryl may be substituted at various positions with diverse substituents, and specifically, with a cyano group, a bromo group, a halo group, a hydroxy group, a nitro group, a $C_1$-$C_4$ substituted or unsubstituted straight chain or branch chain alkyl group, a $C_1$-$C_4$ straight chain or branch chain alkoxy group, an alkyl-substituted sulfanyl group, a phenoxy group, a $C_3$-$C_6$ cycloheteroalkyl group, or a substituted or unsubstituted amino group. The aryl group includes, but is not limited to, a phenyl group, a substituted phenyl group, a naphthyl group, and a substituted naphthyl group, and the above-described aryl group substituent may specifically be a small number of alkyl groups or halogen groups. The term "heteroaryl" used herein is a heterocyclic aromatic group which contains N, O, or S as a heteroatom. Practically, the heteroaryl may be a heterobiaryl containing S as a heteroatom. The term "aryl group substituent" used herein may include an alkyl, a cycloalkyl, a cycloaryl, an aryl, and a heteroaryl, and selectively include one or more substituents selected from a halo, a haloalkyl, an alkyl, an arylalkyl, a heteroarylalkyl, an alkenyl including 1 to 2 double bonds, an alkynyl including 1 to 2 triple bonds, a hydroxy, and a polyhaloalkyl. Specifically, the aryl group substituent may include a $C_1$-$C_5$ alkyl, a $C_1$-$C_5$ alkoxy, or halogen.

The term "alkoxy" used herein is an —O-alkyl group, and examples thereof include methoxy, ethoxy, propoxy, and the like, but are not limited thereto.

The term "$C_7$-$C_{16}$ aralkyl" used herein means a $C_1$-$C_{10}$ alkyl substituted with one or two or more phenyl rings at any position, and examples thereof include benzyl, 2-phenylethyl, 3-phenyl(n-prop-1-yl), 4-phenyl(hex-1-yl), 3-phenyl (n-am-2-yl), 3,3-diphenylpropyl, and the like, but are not limited thereto.

The term "$C_3$-$C_{15}$ cycloalkyl" used herein means a saturated hydrocarbon of a mono ring or multi rings having 3 to 15 carbon atoms, more practically 3 to 10 carbon atoms, and even more practically 3 to 6 carbon atoms, and examples thereof include, but are not limited to, a cyclopropyl ring, a cyclobutyl ring, a cyclohexyl ring, or a cycloheptyl ring, and the like. The term "$C_4$-$C_{20}$ alkylcycloalkyl" used herein means an alkyl having 4 to 20 carbon atoms substituted with an alkyl in the above-described cycloalkyl.

The term "halogen" used herein includes F, Cl, Br, and I. The term "ester" used herein means a functional group represented by —COOR (R is alkyl or aryl), and is specifically an ester having 2 to 10 carbon atoms. The term "carboxyl" used herein means a functional group represented by —COOH, and is practically a carboxyl group having 2 to 10 carbon atoms.

In a certain embodiment, the polyorgano-silsesquioxane of the present invention is a copolymer including a phenyl group and a 3-glycidoxypropyl group as an organic functional group (See, Formula 2).

In the polyorgano-silsesquioxane copolymer of this invention, the phenyl group enhance refractive index of a coating solution, and may serve as an antenna which effectively absorbs light in an UV light region when the copolymer is used in the preparation of a wavelength converting sheet, and a glycoloxy functional group may serve a function of inducing the curing during the preparation of a wavelength converting sheet because the glycoloxy functional groups are linked to each other by an external stimulus such as heat, a catalyst, and light, and simultaneously a function of stabilizing the wavelength converting agent as it facilitates coordination on the surface of metal such as metal ions, semiconductor quantum dots and the like. In order to change the degree of hardness and refractive index of a final thin film, each of m and n may be adjusted in an integer range of 1 to 10,000, and the ratio between the two integers may also be appropriately adjusted.

In a certain embodiment, the ratio of m to n is in a range of 1:9 to 9:1 in the polyorgano-silsesquioxane polymer of the present invention represented by the Formula 1, and more practically 6:4.

In a certain embodiment, the polyorgano-silsesquioxane of this invention has a number average molecular weight in a range of $10^2$ to $10^6$.

In a certain embodiment, the polyorgano-silsesquioxane of the present invention may be included in an amount of 0.5 to 90 wt %, more practically 0.5 to 80 wt %, even more practically 1.0 to 70 wt %, and still even more practically 1.0 to 60 wt % based on the entire coating composition, but is not limited to.

Further, when a wavelength converting thin film/sheet is prepared using the polyorgano-silsesquioxane of the present invention, the formed wavelength converting thin film/sheet exhibits the following excellent characteristics: (a) exhibits excellent light transmittance, thermal resistance, and photodegradation resistance; (b) low moisture and oxygen permeability; (c) less yellowing, and less photobleach due to exposure to a light source such as solar light and illumination for a long time as compared to yellowing and photobleach in other polymer materials; and (d) little deterioration in photoluminescence efficiency. Furthermore, since the polyorgano-silsesquioxane solution has a higher visible light transmittance of 80% or more, and excellent solubility and dispersibility toward a material such as lanthanide and transition compounds and semiconductor nanocrystals, the wavelength converting thin film/sheet is prepared using the polyorgano-silsesquioxane of the present invention, and thus may maintain high transparency even though being mixed with the materials.

In a certain embodiment, the transmittance of the present coating composition is 50% or more, more practically 60% or more, even more practically 70% or more, still even more practically 80% or more, and most practically 90% or more.

The wavelength converting agent capable of being used in the coating composition of this invention is possible to be any wavelength converting agent publicly known in the art, and examples thereof include at least one wavelength converting agent selected from the group consisting of a lanthanide compound, a transition metal compound, an organic dye, and a semiconductor nanocrystal (quantum dot).

In a certain embodiment, a lanthanide metal element or a transition metal element capable of being used as a wavelength converting agent in the coating composition of this invention may be obtained from nitric acid-based, carbonic acid-based, halogen-based, sulfuric acid-based, oxide-based, or phosphoric acid-based compounds, acetate, acetonitrile, or a coordinated organic compound, and more specifically, the lanthanide compound is a compound including a lanthanide metal selected from the group consisting of La, Ce, Pr, Nd, Pm, Sm, Eu, Gd, Tb, Dy, Ho, Er, Tm, Yb and Lu, and the transition metal compound is a compound including a transition metal selected from the group consisting of Mn, Fe, Co, Ni, Cu, Zn, Y, Zr, Ru, Rh, Ag, Cd, Ir, W, Au and Hg.

In a certain embodiment, an organic dye capable of being used as a wavelength converting agent in the coating composition of this invention includes one or more selected from the group consisting of organic molecules including aromatic, alicyclic, ether, halogenated hydrocarbon or terphenyl functional groups, and polymers or combinations thereof, more practically one or more selected from the group consisting of coumarin, rhodamine, porphyrin, fluorescein, lumogen, and cyanomethylene, even more practically coumarin, and most practically, coumarin 6 or a poly coumarin (See, Examples 1 to 20).

In a certain embodiment, the semiconductor nanocrystal (quantum dot) capable of being used as a wavelength converting agent in the coating composition of this invention includes one or more semiconductor nanocrystals selected from the group consisting of CdTe/CdSe, CdS(Se)/CdTe, CdS(Se)/ZnTe, CuInS(Se)/ZnS(Se), Cu(GaIn)S(Se)/ZnS (Se), ZnTe/CdS(Se), GaSb/GaAs, GaAs/GaSb, Ge/Si, Si/Ge, PbSe/PbTe, PbTe/PbSe, CdTe, CdSe, ZnTe, CuInS, CuGaS, Cu(Ga,In)S, CuGaSnS(Se), CuGaS(Se), CuSnS (Se), ZnS, CuInSe, CuGaSe, ZnSe, ZnTe, GaSb, GaAs, Ge, Si, PbSe, PbTe, PbTe and PbSe, and the semiconductor nanocrystals have a particle size of 2 to 40 nm. The term "semiconductor nanocrystal (quantum dot)" used herein means small particles of an inorganic semiconductor typically having a particle size of about 40 nm or less, and may absorb light with a first wavelength, and then emit light with a second wavelength. At this time, the second wavelength is longer than the first wavelength.

According to the present invention, the coating composition of this invention includes a polyorgano-silsesquioxane and a wavelength converting agent at an optimal proportion, and specifically, the wavelength converting agent may be included in a weight of up to ½ of the weight of polyorgano-silsesquioxane in the present coating composition. For example, the ratio of polyorgano-silsesquioxane:wavelength converting agent in the coating composition of this invention may be 2:1 or more, more practically 5:1 or more, even more practically 20:1 or more, and still even more practically 100:1 or more. In addition, when the content of wavelength converting agent used in the coating composition of the present invention is less than 0.0001 wt %, the wavelength conversion efficiency significantly decreases, and when the content is more than 50 wt %, it is difficult to apply the wavelength converting agent to the preparation of a wavelength converting sheet, and light transmittance may deteriorate because of low processability.

In a certain embodiment, at least one wavelength converting agent of the present invention may be included in an amount of 0.00001 to 50 wt %, more practically 0.00005 to 40 wt %, and even more practically 0.0001 to 30 wt % based on the entire coating composition, but is not limited thereto.

The solvent used in the preparation of the coating composition of this invention is possible to be any organic solvent publicly known in the art, and examples thereof include a petroleum solvent, an aromatic or alicyclic solvent, an ether, a halogenated hydrocarbon or terphenyl mixture, or a mixture thereof. Specifically, an organic solvent capable of being used in the present invention includes: an aliphatic hydrocarbon solvent such as hexane; an aromatic hydrocarbon solvent such as anisol, mesitylene, and xylene; a ketone-based solvent such as methyl isobutyl ketone, 1-methyl-2-pyrrolidinone, and acetone; an ether-based solvent such as cyclohexanone, tetrahydrofuran, and isopropyl ether; an acetate-based solvent such as ethyl acetate, butyl acetate, and propylene glycol methyl ether acetate; an alcohol-based solvent such as isopropyl alcohol and butyl alcohol; an amide-based solvent such as dimethylacetamide and dimethylformamide; a silicon-based solvent; or a mixture thereof, but is not limited to. In a certain embodiment, the solvent used in the coating composition of the present disclosure includes an ether-based solvent.

In addition to the constituent components (polyorgano-silsesquioxane, a wavelength converting agent, and a solvent), the present coating composition may further include additives. In a certain embodiment, the coating composition of this invention further includes a curing catalyst, a binder, a metal particle, a spherical particle or a combination thereof, and the whole content of these components is 0.0001 to 10 wt % in the entire coating composition.

The curing catalyst serves to facilitate the curing of the coating composition at a temperature of 100° C. or less, and thus help the process in which polyorgano-silsesquioxane is cured, and representative examples thereof include an organic base catalyst and a metal catalyst.

An organic base catalyst capable of being used in the present invention includes amines such as N,N'-trimethylenebis(1-methylpiperidine), bis(2-dimethylaminoethyl) ether, N,N'-dimethylpiperazine, 4-(dimethylamino)pyridine, N,N'-dimethylcyclohexylamine, N,N-dimethylbenzylamine, N,N,N',N',N"-pentamethyldiethylenetriamine, N,N-dimethylcetylamine, trihexylamine, triethylamine, and ethylenediamine, and these may be used either alone or in combination. For example, an organic base catalyst may be added in an amount of 0.1 to 5.0 wt % based on the total weight of the coating composition of the present invention. When an inorganic base catalyst is used in an amount of less than 0.1 wt %, the catalyst activity may deteriorate, and when the content is more than 5.0 wt %, light transmittance of a wavelength converting layer may deteriorate.

A metal catalyst capable of being used in the present invention may include not only an organic acid complex, an inorganic acid complex, or an organic metal compound, which includes metal such as palladium, platinum, rhodium, nickel, iridium, ruthenium, osmium, and cobalt, but also a metal particulate or a precursor which may form a metal particulate. The metal catalyst may be added in an amount of 0.01 to 1.0 wt % based on the entire weight of the coating composition, and when the content of the metal catalyst is less than 0.01 wt %, the catalyst activity may deteriorate, and when the content is more than 1.0 wt %, the light transmittance of the wavelength converting layer may deteriorate.

The metal particle may be used with a wavelength converting agent and serve to enhance the wavelength conversion efficiency of the wavelength converting agent, and this is caused by a phenomenon in which the metal particles amplify light emission of a wavelength converting agent adjacent to the surface thereof due to a surface plasmon resonance (SPR) phenomenon. The metal particle includes gold, silver, platinum, copper particles, and the like, and the shape and size thereof may also be controlled such that surface plasmon resonance occurs on the surface of the metal.

A spherical particle is used with a wavelength converting agent and serves to enhance the wavelength conversion efficiency of the wavelength converting agent, and this results from a phenomenon called photonic bandgap, in which light scattering occurs from the surface of the spherical particle and a phenomenon in which spherical particles are regularly arranged to form photonic crystals and cause higher light extraction. Examples of an inorganic material particle among these spherical particles include silica, zinc oxide, alumina, titania spherical particles, and the organic material particle may be polystyrene and polymethyl methacrylate, which are formed as a polymer material, but is not limited thereto. In a certain embodiment, the size of spherical particles capable of being used in the present invention is 30 nm to 400 nm, more practically 50 nm to 350 nm, and even more practically 100 nm to 300 nm.

According to this invention, the present coating composition has an excellent light transmittance, and thus may form a transparent thin film/sheet, thereby contributing to remarkable enhancement of light conversion efficiency. In general, the transmittance of the coating solution is determined depending on the particle size and solubility of incorporated wavelength converting agent. For example, a transparent coating solution is conveniently prepared by dissolving a lanthanide compound, a transition metal compound or an organic dye at a concentration equal to or less than the solubility in the coating composition of the present disclosure, and adding semiconductor nanocrystals, or inorganic nanophosphor particles with a small size of 100 nm or less. Further, a thin film/sheet for wavelength conversion may be conveniently prepared by using the coating composition of the present invention. The thin film/sheet may be formed by mixing a solvent, polyorgano-silsesquioxane, a wavelength converting agent, and selectively an additive, performing ultrasonic treatment to prepare a coating composition, applying the prepared coating composition on a substrate, and then curing the substrate.

In a certain embodiment, the substrate include, but is not limited to, plastic, stainless steel, aluminum, glass, quartz, a solar cell, an LED chip, and a fiber.

As a method for applying the coating composition of the present invention on a substrate is possible to utilize any well-known method in the art, and examples thereof include, but is not limited to, a non-vacuum thin film process such as a doctor blade coating method, a screen coating method, a spin coating method, a spray coating method, and a paint coating method.

In addition, the present method may further include a step of patterning the surface of the sheet after applying. In a certain embodiment, the addition of patterning in the preparation of the thin film/sheet of the present invention may induce an increase in at least two-fold photoluminescence intensity.

Furthermore, the method of the present invention may further include a step of applying a polyorgano-silsesquioxane protective layer. More specifically, the thin film/sheet capable of being prepared according to the present method may be composed of multi-layer. That is, the thin film/sheet may be prepared by forming a first thin film/sheet using a first coating composition (for example, a polyorgano-silsesquioxane coating composition containing a wavelength converting agent), and then applying a second thin film on the first thin film/sheet using a second coating composition (a coating composition different from the first coating composition, for example, a polyorgano-silsesquioxane coating composition without the wavelength converting agent). In this case, as the formed thin film/sheet has multiple layers, the same light converting properties may be possessed and simultaneously lifetime may be much significantly improved.

In a certain embodiment, the curing method capable of being used in the present invention is performed by using one or more methods selected from the group consisting of heating, light irradiation, disposition at room temperature, moisture injection and catalyst injection. Representatively, thermal curing may be performed at a temperature of 100 to 400° C. for 1 to 150 min, and more practically at a temperature of 150 to 250° C. for 60 to 90 min.

Additionally, the coating composition of the present invention may include a binder in order to enhance adhesive strength between a substrate and a cured product. As the binder, any material publicly known in the art may also be applied, and examples thereof include 3-aminopropyl(triethoxysilane), N-(2-aminoethyl)-3-aminopropyltriethoxysilane, N-(3-ethoxysilylpropyl)-4,5-dihydroimidazole, 3-aminopropyl(methyldiethoxysilane), vinyltriethoxysilane, trifluoropropyltrimethoxysilane, cyanoethyltrimethoxysilane, methacryloylpropyltriethoxysilane, (3-acryloylpropyl)trimethoxysilane, vinyltriethoxysilane, 3-isocyanatopropyltriethoxysilane, or a combination thereof. The binder may be used as a mixture in an amount of 0.1 to 5.0 wt % based on the total weight of the coating composition, and when the content of binder is less than 0.1 wt %, adhesive strength between the substrate and the cured product is not enhanced, and when the content of binder is more than 5.0 wt %, transmittance of the wavelength converting layer may deteriorate, or it may be difficult to form a good-quality thin film/sheet.

Accordingly, the present invention provides a wavelength converting thin film/sheet prepared according to the above-described method. In a certain embodiment, the thickness of the present wavelength converting thin film/sheet may be appropriately adjusted according to a desired use, for example, 10 nm to 10 cm, more practically 50 nm to 1 cm, and even more practically 100 nm to 500 μm, but is not limited to. In a certain embodiment, the wavelength converting thin film/sheet of this invention has a visible light transmittance of 70% or more, more practically 75% or more, and even more practically 80% or more as compared to that of the air.

In still another aspect of this invention, there is provided a solar cell comprising the above-described wavelength converting sheet.

In yet another aspect of this invention, there is provided a method for preparing a solar cell, comprising the steps of:
(a) preparing a solar cell; and (b) applying the above-described coating composition on at least one surface of the solar cell, and curing the surface thereof to form a wavelength converting layer.

Since the present solar cell and preparation method thereof comprises the above-described coating composition and the wavelength converting thin film/sheet using the same as an effective component, the common descriptions between them are omitted in order to avoid undue redundancy leading to the complexity of this specification.

In order to be utilized in a solar cell, the wavelength conversion composition needs to have a high conversion efficiency of converting incident solar light energy into electric energy, wherein the conversion efficiency is affected by various factors such as light reflectance of the solar cell, the absorption efficiency at a specific wavelength range, and internal resistance of the cell, and it is known that a silicon solar cell, which has been usually used so far, has a cell efficiency of about 10 to 19%. The solar light includes a light at various wavelength ranges, such as X-ray, UV light, visible light, and infrared light. As means for increasing the conversion efficiency, it is expected that the conversion efficiency of the solar cell may be increased where it is possible to convert light with a short wavelength range (for example, a wavelength range of 400 nm or less) into light with a higher wavelength range (for example, a wavelength range of 500 nm or higher). The thin film/sheet prepared using the coating composition of the present invention may be effectively applied to a wavelength converting composition for a solar cell in that the thin film/sheet absorbs light at a low wavelength range and exhibits fluorescence/luminescence at a higher wavelength range.

In a certain embodiment, a wavelength converting thin film/sheet containing the present coating composition exhibits a light emitting wavelength increased at 400 nm to 1,100 nm (more specifically at 450 to 800 nm) through an absorption wavelength at 480 nm or less (more specifically at 350 to 450 nm).

The features and advantages of this invention are summarized as follows:

(a) The present invention relates to a coating composition having excellent wavelength conversion efficiency and a wavelength converting thin film/sheet prepared using the same.

(b) The coating composition of the present disclosure includes 1 to 60 wt % of polyorgano-silsesquioxane, 0.0001 to 30.0 wt % of a wavelength converting agent, and a solvent, and exhibits a transmittance of 70% or more as compared to that of an aqueous solution.

(c) A wavelength converting thin film/sheet prepared by using the coating composition has not only excellent photoluminescence, thermal resistance, and light-fastness, but also moisture and oxygen permeability is low, and the visible light transmittance thereof is 70% or more as compared to that of the air, and when patterning is added, the photoluminescence intensity of sheet is at least two-fold higher than that of a non-patterned sheet.

(d) Therefore, the coating composition of the present invention may be conveniently used in the preparation of a wavelength converting thin film/sheet, and feasibly applied to the preparation of a solar cell in an efficient manner.

DETAILED DESCRIPTION OF THE DISCLOSURE

Hereinafter, the present invention will now be described in further detail by examples. It would be obvious to those skilled in the art that these examples are intended to be more concretely illustrative and the scope of the present invention as set forth in the appended claims is not limited to or by the examples.

EXAMPLE

Examples 1 to 20

Preparation of Coating Composition

After 0.8 g of polyorgano-silsesquioxane was added to a glass container, and a wavelength converting agent, an additive, and a solvent (hexane, tetrahydrofuran (referred to as THF), chloroform, or toluene) were introduced into the container as in the composition shown in Table 1, the container was sealed and subjected to ultrasonic treatment in an ultrasonic bath until a uniform solution was obtained, resulting in a coating composition.

TABLE 1

| | Composition of Coating Solution | | | | |
|---|---|---|---|---|---|
| | Wavelength converting agent 1 | Wavelength converting agent 2 | Additive (g) | Solvent | Transmittance (%) of Coating Solution (Visible light region) |
| Example 1 | 0.0005 g of Coumarin 6 | — | — | 3.2 g of THF | 98.8 |
| Example 2 | 0.001 g of BASF Lumogen V570 | — | — | 3.2 g of THF | 99.0 |
| Example 3 | 0.001 g of Poly Coumarin | — | — | 3.2 g of THF | 92.2 |
| Example 4 | 0.0005 g of Coumarin 6 | 0.001 g of BASF Lumogen V570 | — | 3.2 g of THF | 99.0 |
| Example 5 | 0.001 g of CdSe 490 nm semiconductor nanocrystals | — | — | 3.2 g of THF and 0.1 g of Chloroform | 99.8 |
| Example 6 | 0.001 g of CdSe 620 nm semiconductor nanocrystals | — | — | 3.2 g of THF and 0.1 g of Hexane | 99.7 |
| Example 7 | 0.001 g of CuInS/ZnS 570 nm semiconductor nanocrystals | — | — | 3.2 g of THF | 99.7 |
| Example 8 | 0.0005 g of Coumarin 6 | 0.001 g of CdSe 490 nm semiconductor nanocrystals | — | 3.2 g of THF and 0.1 g of Chloroform | 99.0 |
| Example 9 | 0.05 g of Eu(NO$_3$)$_3$•5H$_2$O | — | — | 3.2 g of THF | 98.9 |
| Example 10 | 0.05 g of Tb(NO$_3$)$_3$•6H$_2$O | — | — | 3.2 g of THF | 98.7 |
| Example 11 | 0.05 g of Tb(NO$_3$)$_3$•6H$_2$O | 0.05 g of Eu(NO$_3$)$_3$•5H$_2$O | — | 3.2 g of THF and 0.600 g of Toluene | 99.4 |
| Example 12 | 0.01 g of Zn(OAc)$_2$ | — | — | 3.2 g of THF | 99.9 |
| Example 13 | 0.05 g of EuFOD | — | — | 3.2 g of THF | 99.5 |
| Example 14 | 0.05 g of Tb(thd)$_3$ | — | — | 3.2 g of THF | 99.4 |

TABLE 1-continued

| | Composition of Coating Solution | | | | |
|---|---|---|---|---|---|
| | Wavelength converting agent 1 | Wavelength converting agent 2 | Additive (g) | Solvent | Transmittance (%) of Coating Solution (Visible light region) |
| Example 15 | 0.05 g of $Eu(NO_3)_3 \cdot 5H_2O$ | 0.0005 g of Coumarin 6 | — | 3.2 g of THF | 99.3 |
| Example 16 | 0.05 g of $Eu(NO_3)_3 \cdot 5H_2O$ | — | 0.001 g of BASF Igracure | 3.2 g of THF | 98.7 |
| Example 17 | 0.05 g of $Eu(NO_3)_3 \cdot 5H_2O$ | — | 0.01 g of gold nanoparticles (10 nm) | 3.2 g of THF | 98.5 |
| Example 18 | 0.05 g of $Eu(NO_3)_3 \cdot 5H_2O$ | — | Silica spherical particles (100 nm) | 3.2 g of THF | 93.4 |
| Example 19 | 0.05 g of $Eu(NO_3)_3 \cdot 5H_2O$ | | | 1.2 g of THF | 98.1 |
| Example 20 | 0.05 g of $Eu(NO_3)_3 \cdot 5H_2O$ | | | 6.2 g of THF | 99.3 |

Each material used in Examples 1 to 20 is as follows:

As polyorgano-silsesquioxane, a copolymer having a structure of the following Formula 2 (m:n=6:4) was synthesized as follows and used.

(a) 3-Glycidoxypropyltrimethoxysilane (0.24 mol) and phenyltrimethoxysilane (0.16 mol) were mixed to prepare a monomer mixture. Additionally, an aqueous solution prepared by dissolving potassium carbonate (0.2 g) in distilled water (24 g) was mixed with HPLC-grade tetrahydrofuran (40 g) to prepared a water-containing mixture solvent.

(b) A polymerization reaction was performed by adding the aforementioned mixture monomer solution to the water-containing mixture solvent in a dropwise manner while stirring, and terminated after the reaction was carried out at 25° C. for 14 days. In order to recover the polyorgano-silsesquioxane copolymer produced, extraction was performed by using a solvent, such as chloroform, methylene chloride, toluene, and xylene, which is capable of dissolving a polymer while not being mixed with water, and a purified copolymer was collected by drying the solvent from the extracted solution.

Coumarin 6 (product No. 442631; Aldrich) and Lumogen V570 (BASF) as an organic dye were purchased and used, and a polymer having a structure of the following Formula 3 as a poly coumarin was directly synthesized through an azide-alkyne click reaction to react a coumarin 6 with an alkyne group and a polystyrene with an azide in a DMF solvent using a Cu catalyst and a PMEDTA ligand, and used.

Formula 3

Formula 2

CdSe nanoparticles or CuInS/ZnS 570 nm luminescent nanoparticles were used as a semiconductor nanocrystal (or quantum dot), and the CdSe nanoparticles were purchased from Nanosquare INC. and used, and the CuInS/ZnS nanoparticles were directly synthesized and used.

Terbium (III) tris(2,2,6,6-tetramethyl-3,5-heptanedionate (product No., 434051; Aldrich; hereinafter, referred to as 'Tb(thd)$_3$') and terbium (III) nitrate hydrate (product No., 74103; Alfa Aesar) were used as a supply source of terbium ions (Tb$^{3+}$). Tris(6,6,7,7,8,8,8-heptafluoro-2,2-dimethyl-3,5-octanedionato)europium (III) (product No., 33541; Alfa Aesar; hereinafter, referred to as 'Eu(FOD)$_3$') was used as a supply source of europium ions (Eu$^{3+}$). Acetyl zinc (Zn(COOCH$_3$)$_2$, Zn(OAc)$_2$) (Aldrich) was used as a supply source of zinc ions (Zn$^{2+}$).

Products having a purity of 99% or more from Daejung Chemical & Metals Co., Ltd. were used as hexane, tetrahydrofuran (THF), chloroform, and toluene.

A photocurable agent Igracure® (BASF) was used as an additive, and a nanoparticle colloidal solution having a particle diameter of 10 nm (product No., G1527; Sigma) was purchased as a metal particle additive, and used by substituting the solvent with hexane. One wt % of silica aqueous solution having a particle size of 100 nm was purchased from Polysciences, INC. as a spherical silica particle, and used by exchanging the solvent with ethanol.

Figure 1:
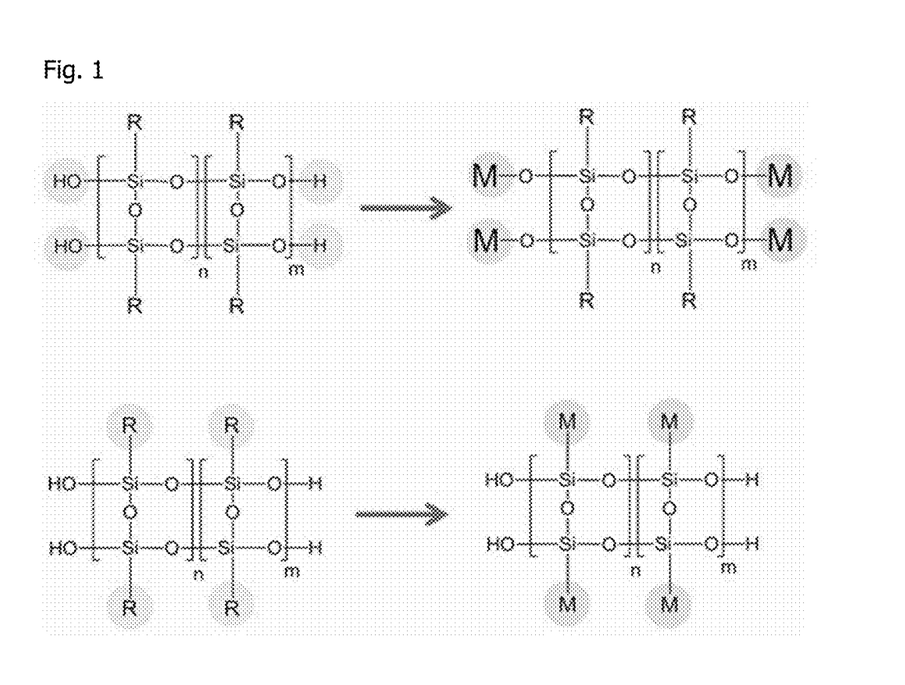
FIG. 1 is a schematic view illustrating a manner in which a wavelength converting agent (M) is coordinated to a ladder-like polyorgano-silsesquioxane. Upper panel, a coordinate bond through an end silica Si—OH group; and lower panel, a coordinate bond through functional groups (R).
Figure 2:
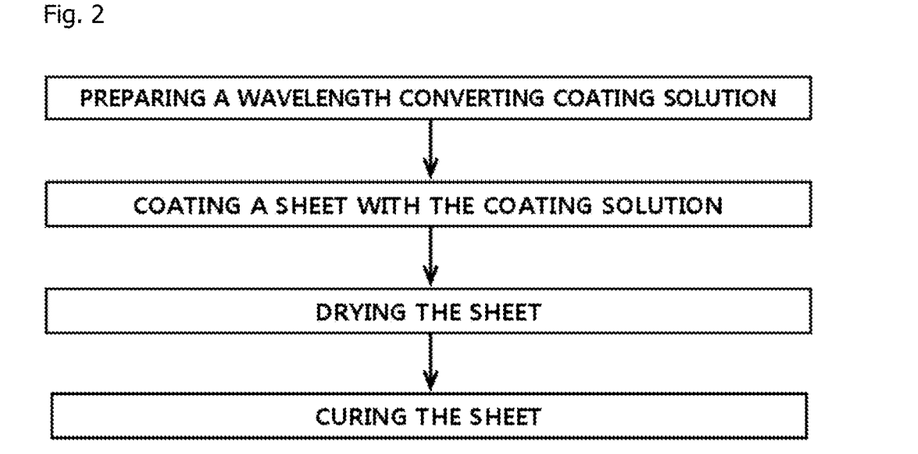
FIG. 2 is a schematic view illustrating a preparation method of a wavelength converting sheet (thin film) according to the present invention.
Figure 3A:
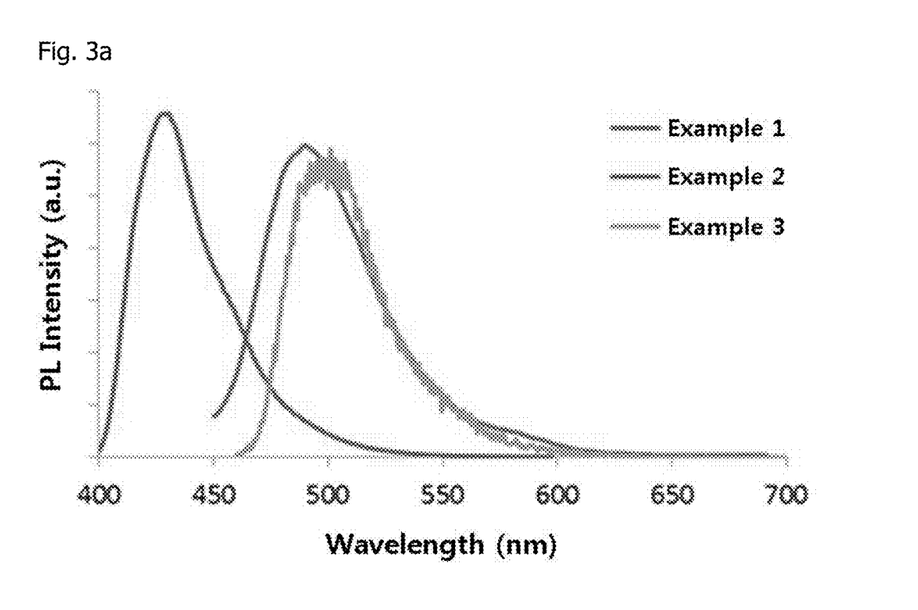
FIGS. 3a to 3f are each result showing photoluminescence spectra of the coating compositions prepared in Examples 1 to 20 of the present invention.
Figure 3B:
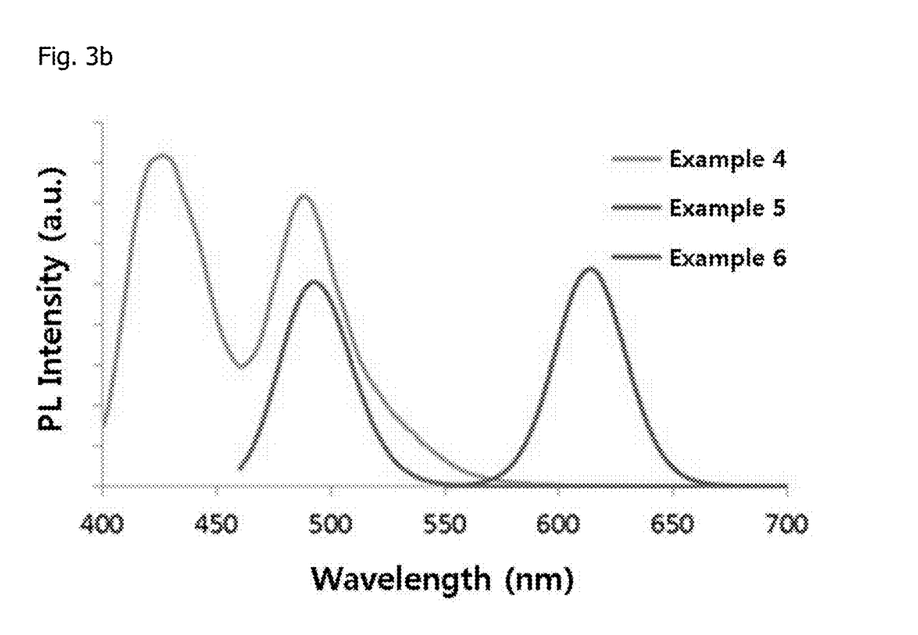
Figure 3C:
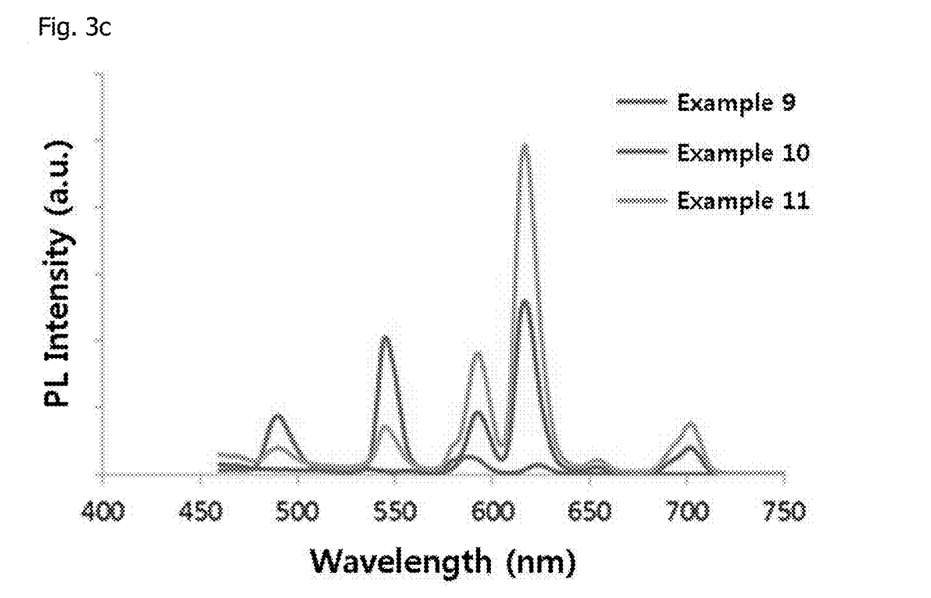
Figure 3D:
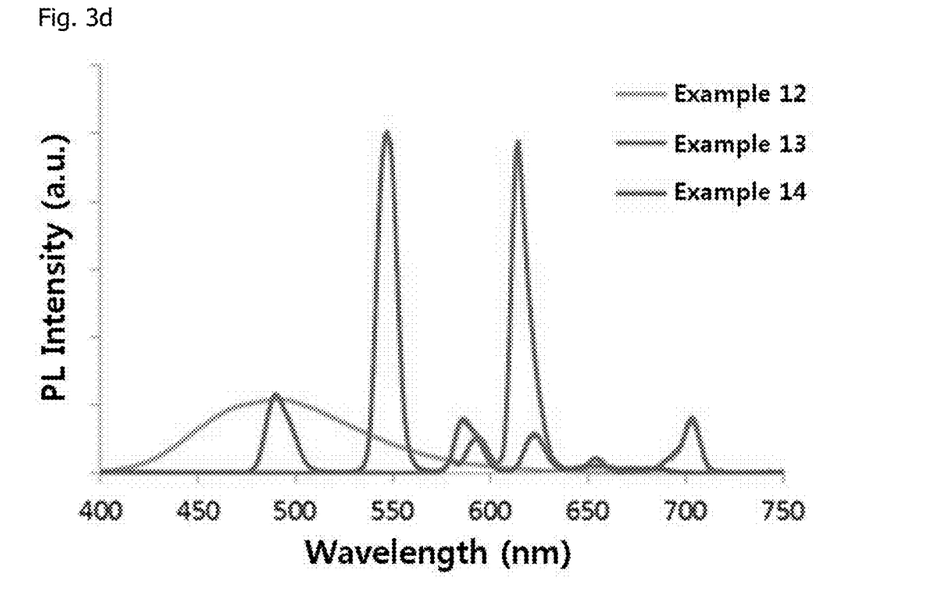
Figure 3E:
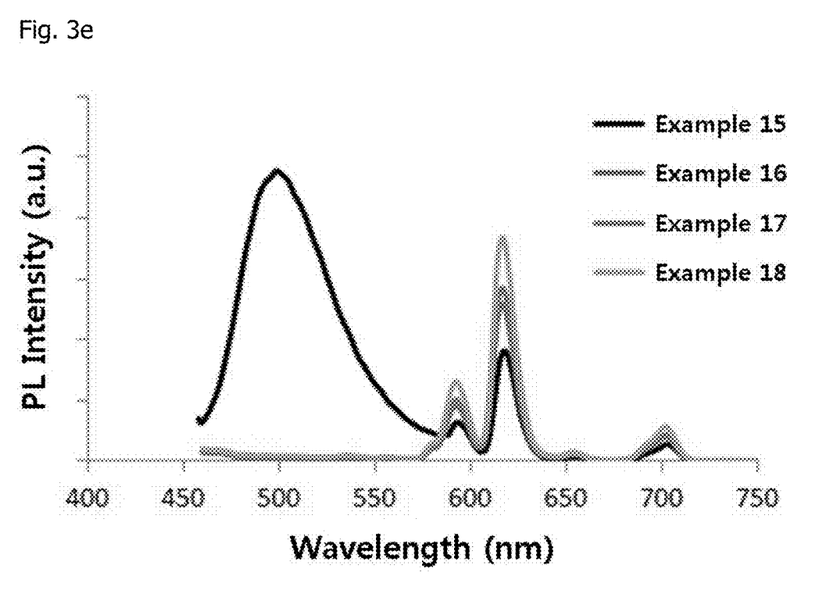
Figure 3F:
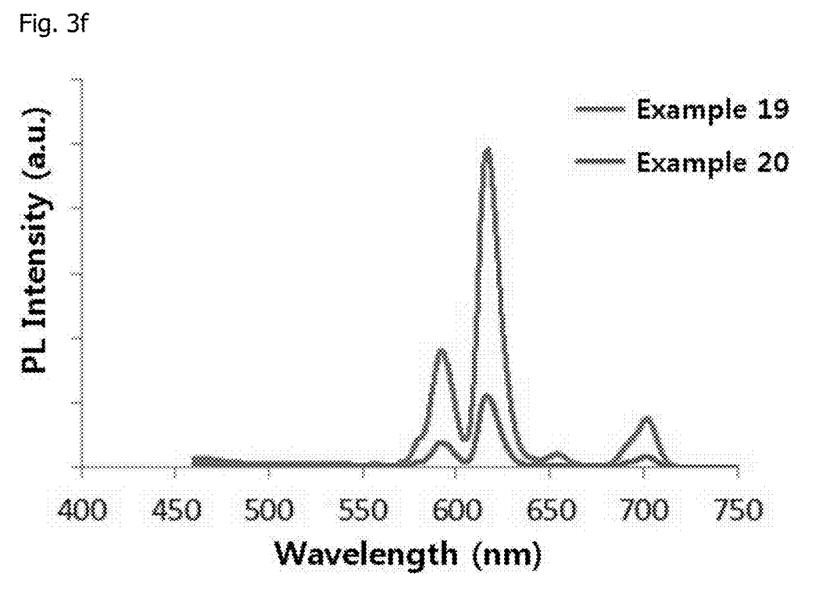

The photoluminescence spectra measured from the coating solution in Examples 1 to 18 were illustrated in FIGS. 3a to 3e. In the case of the coating solutions in Examples 19 and 20, photoluminescence spectra are measured as same as in Example 9, but a change in photoluminescence intensity was observed by varying the amount of solvent added (FIG. 3f).

Example 21

Preparation of Wavelength Converting Sheet

A scotch tape (product No., 122A; 3M) was adhered to the edge of a glass substrate (a thickness of 1.0 mm; product manufactured by Knittel Glaser Inc.) with a size of 1 cm×1 cm, and 200 µl of the coating solution in Table 1 was dropped onto the glass substrate, and then uniformly applied using a blade (Dorco Corporation Ltd.). In order to remove the solvent from the coating solution, the thin film was disposed in a hood for 1 hour. The prepared transparent sheet was subjected to heat treatment at 150° C. in an oven for 1 hour to prepare a transparent sheet which had been completely cured. At this time, the curing of coating solution used with the BASF Igracure additive as in Example 16 could be facilitated within 10 min at room temperature under UV light using photocuring instead of thermal curing.

Figure 4:
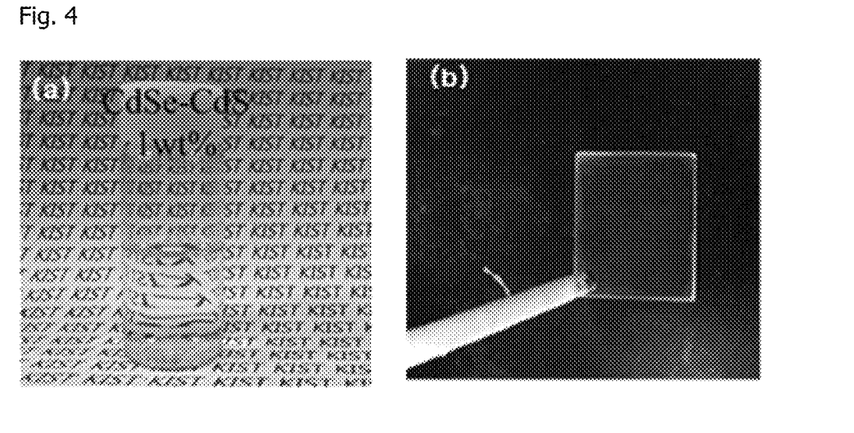
FIG. 4 is a result showing (a) a photograph of a coating composition in Example 5, and (b) a photograph of a wavelength converting sheet prepared using the same under ultraviolet (UV) light.

All of the prepared sheets exhibited transparency, and as a representative example among them, photographs of a coating solution containing CdSe semiconductor quantum crystals in Example 5 and a transparent sheet prepared from the solution under UV light (UV lamp (Vilerber Lourmat Inc.), 365 nm) are illustrated in FIG. 4 (FIG. 4(a): the coating solution, FIG. 4(b): the wavelength converting sheet under UV light).

In the case of the sheets prepared from the coating solutions in Examples 1 to 18, their thickness were about 300 to 500 µm; in the case of the sheet prepared from the coating solution in Example 19, the thickness was about 600 to 1,000 µm; and in the case of the sheet prepared from the coating solution in Example 20, the thickness was about 50 to 150 µm.

Example 22

Figure 5:
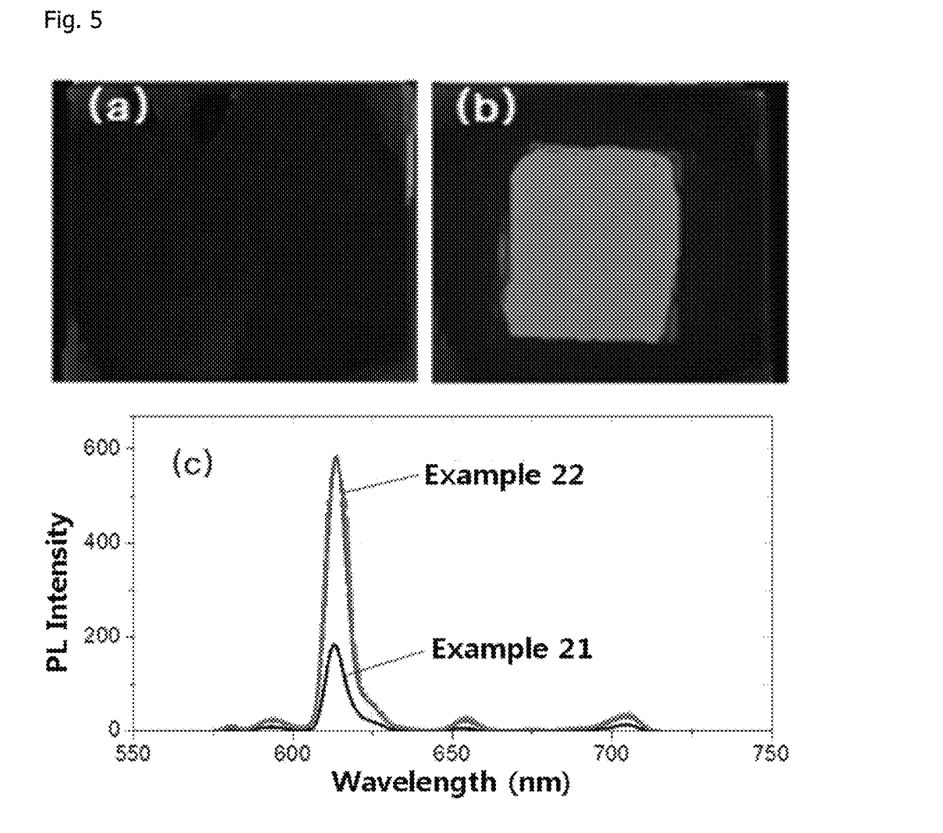
FIG. 5 represents (a) a photograph of a pattern-less wavelength converting sheet in Example 21 and (b) a photograph of a patterned wavelength converting sheet in Example 22 under UV light, and is (c) a result measuring the photoluminescence spectra thereof.
Figure 6:
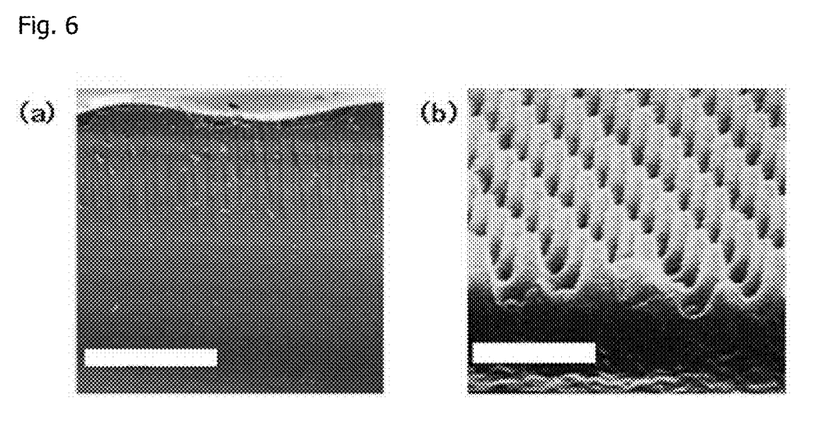
FIG. 6 is a SEM photograph of each lateral face of (a) a pattern-less wavelength converting sheet in Example 21 and (b) a patterned wavelength converting sheet in Example 22. Scale bar=500 nm.

Surface-Patterning Process for Enhancing Light Emission of Wavelength Converting Sheet A scotch tape (product No., 122A; 3M) was adhered to the edge of a glass substrate (a thickness of 1.0 mm) with a size of 1 cm×1 cm, and 200 µl of the coating solution containing Eu(NO$_3$)$_3$.5H$_2$O in Example 9 among the coating solutions in Table 1 was dropped onto the glass substrate, and then uniformly applied using a blade. In order to remove the solvent from the coating solution, the thin film was disposed in a hood for 1 hour. A 1 cm×1 cm PDMS stamp having a nanopattern was placed on the coating solution-applied surface and then the glass substrate was pressed with a mounting press so as to have a pressure of 5×10$^{-2}$ Pa, and subjected to heat treatment at 150° C. for 1 hour. After cooled to room temperature, the PDMS stamp was removed to obtain a patterned wavelength converting sheet. The coating agent in Example 9 was used to prepare the patternless wavelength converting sheet (a) in Example 21 and the patterned wavelength converting sheet in Example 22, and then these sheets were compared by illustrating the photographs thereof under UV light (UV lamp (Vilerber Lourmat Inc.), 365 nm) in FIGS. 5(a) and 5(b), respectively, and the photoluminescence spectra of these sheets are shown in FIG. 5(c). It was confirmed that the patterned wavelength converting sheet exhibited much more intense light emission than the pattern-less wavelength converting sheet as in FIG. 5(b). According to FIG. 5(c), the patterned sheet increased light emission at least 2.5-fold higher than the pattern-less sheet. An SEM image of the patterned wavelength converting sheet in Example 22 is represented in FIG. 6.

Example 23

Figure 7:
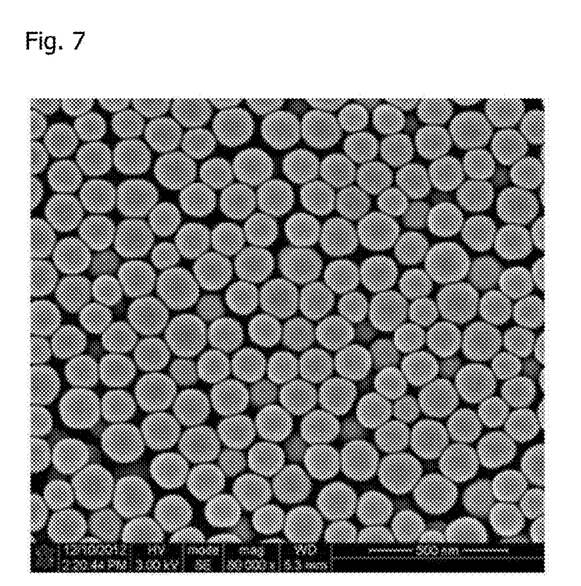
FIG. 7 is a front SEM photograph of the photonic crystallized wavelength converting sheet in Example 23. Scale bar=500 nm.

Process of Forming Photonic Crystals for Enhancing Light Emission of Wavelength Converting Sheet In the same manner as in Example 18, 0.1 mL of a colloidal solution containing silica spherical particles (diameter of 100 nm, a 1 wt % ethanol solution; Polysciences INC.) was mixed with 4 mL of a coating solution including Eu(NO$_3$)$_3$.5H$_2$O, and the mixture was subjected to ultrasonic treatment. A scotch tape (Cat 122A) was adhered to the edge of a glass substrate (a thickness of 1.0 mm) with a size of 1 cm×1 cm, and 200 µl of the colloidal coating solution was dropped onto the glass substrate, and then naturally dried in a hood for 1 hour. In order to remove the solvent from the coating solution, the thin film was stored in a hood for 1 hour. The dried sheet was subjected to heat treatment at 150° C. in an oven for 1 hour to prepare a transparent photonic crystal sheet which had been completely cured. An SEM image of the photonic-crystallized wavelength converting sheet in Example 23 is illustrated in FIG. 7.

Comparative Example 1

Preparation of Dimethyl Silicone-Based Polymer (PDMS) Sheet Containing Eu(NO$_3$)$_3$.5H$_2$O Wavelength Converting Agent A scotch tape (Cat 122A) was adhered to the edge of a glass substrate (a thickness of 1.0 mm) with a size of 1 cm×1 cm, and 200 µl of a coating solution mixing 16 g of a THF solvent, 4.0 g of a PDMS resin (Sylgard 184; Dow Corning Corporation), and 0.05 g of Eu(NO$_3$)$_3$.5H$_2$O was dropped onto the glass substrate, and then uniformly applied using a blade. The prepared transparent sheet was subjected to heat treatment at 150° C. in an oven for 1 hour to prepare a cured polymer wavelength converting sheet. The light emission of the prepared polymer sheet was compared to that of the wavelength converting sheet formed through thermal curing in Example 9 and the wavelength converting sheet formed through photo curing in Example 16, and the result was illustrated in FIG. 8.

Comparative Example 2

Figure 8:
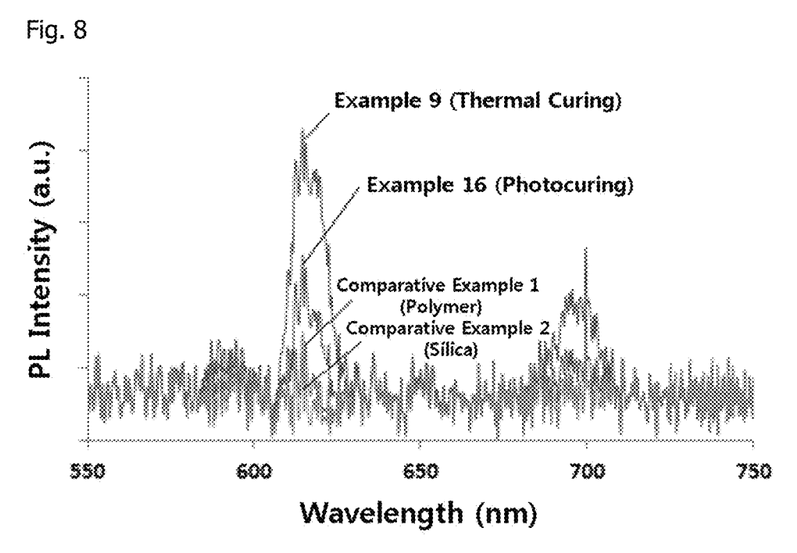
FIG. 8 is a result of photoluminescence spectra comparing a light emission between the wavelength converting sheets formed with the coating compositions of Examples 9 and 16 and those prepared in Comparative Examples 1 and 2.

Preparation of Silica (SiO$_2$) Sheet Containing Eu(NO$_3$)$_3$.5H$_2$O Wavelength Converting Agent A scotch tape (Cat 122A) was adhered to the edge of a glass substrate (a thickness of 1.0 mm) with a size of 1 cm×1 cm, and 200 μl of a polysilazane coating solution mixing 16 g of a dibutyl ether solvent, 4.0 g of polysilazane (DNF Co., Ltd.), and 0.05 g of Eu(NO$_3$)$_3$.5H$_2$O was dropped onto the glass substrate, and then uniformly applied using a blade. The prepared transparent sheet was subjected to heat treatment at 150° C. in an oven for 1 hour to prepare a cured silica (SiO$_2$) wavelength converting sheet. The light emission of the prepared silica sheet was compared to that of the wavelength converting sheet formed by Example 9, and the result was shown in FIG. 8. As illustrated in FIG. 8, it could be confirmed that a thin film formed by photocuring in Example 16 was excellent, and a thin film formed by thermal curing in Example 9 was far excellent as compared to those in Comparative Examples 1 and 2.

Comparative Example 3

Preparation of Dimethyl Silicone-Based Polymer (PDMS) Sheet Containing CdSe 490 nm Luminescent Nanoparticle Wavelength Converting Agent A scotch tape (Cat 122A) was adhered to the edge of a glass substrate (a thickness of 1.0 mm) with a size of 1 cm×1 cm, and 200 μl of a silicone-based polymer (PDMS) coating solution mixing 16 g of a THF solvent, 4.0 g of a PDMS resin (Sylgard 184; Dow Corning Corporation), and 0.001 g of CdSe luminescent nanoparticles (Nanosquare INC.) was dropped onto the glass substrate, and then uniformly applied using a blade. The prepared transparent sheet was subjected to heat treatment at 150° C. in an oven for 1 hour to prepare a cured polymer wavelength converting sheet. The light emission of the prepared polymer sheet of comparative Example 3 was compared to that of the wavelength converting sheet formed by Example 5, and then illustrated in FIG. 9.

Comparative Example 4

Preparation of Silica (SiO$_2$) Sheet Containing CdSe 490 nm Luminescent Nanoparticle Wavelength Converting Agent A scotch tape (Cat 122A) was adhered to the edge of a glass substrate (a thickness of 1.0 mm) with a size of 1 cm×1 cm, and 200 μl of a silica coating solution mixing 16 g of a dibutyl ether solvent, 4.0 g of polysilazane (DNF Co., Ltd.), and 0.001 g of CdSe luminescent nanoparticles (Nanosquare INC.) was dropped onto the glass substrate, and then uniformly applied using a blade. The prepared transparent sheet was subjected to heat treatment at 150° C. in an oven for 1 hour to prepare a cured silica (SiO$_2$) wavelength converting sheet. The light emission of the prepared silica sheet was compared to that of the wavelength converting sheet formed by Example 5, and illustrated in FIG. 9. As confirmed in FIG. 9, it could be seen that light emission of Example 5 was far excellent as compared to those of Comparative Examples 3 and 4.

Experimental Result

1. Characteristics Evaluation of Coating Solution

Hydrogen-Nuclear Magnetic Resonance (H-NMR) Spectrum of Coating Solution

Figure 10:
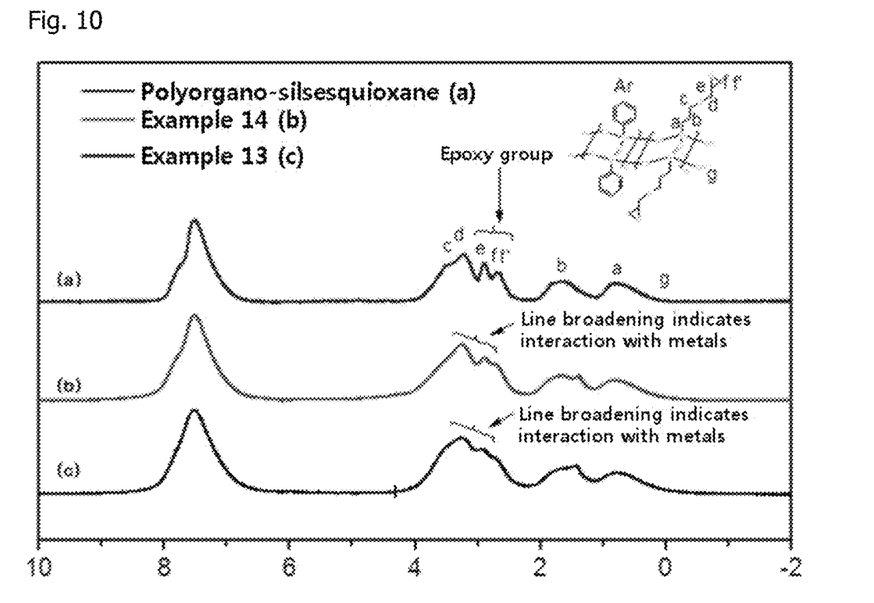
FIG. 10 is a $^1$H-NMR analysis result using the coating composition of polyorgano-silsesquioxane (a), the coating composition prepared in Example 14(b) or Example 13(c).

In order to investigate characteristics of a coating solution mixture, a coating solution (50 μl) was mixed with a CDCl$_3$ (99.80% D) NMR solvent (0.4 ml, Euriso top), and a hydrogen nuclear magnetic resonance (H-NMR) spectrum analysis was performed with a 400 MHz NMR device (Bruker Corporation). Representatively, the analysis results of the coating solutions in Examples 13 and 14 were compared to the analysis result of polyorgano-silsesquioxane such as Formula 2, and are illustrated in FIG. 10. Referring to FIG. 10(*a*), it could be seen that the epoxy functional group of Formula 2 appeared at 2.5 to 4.0 ppm, the alkyl group and the hydroxyl end group appeared at 0 to 2.0 ppm, and the phenyl functional group appeared at 7.0 to 8.0 ppm. In the case of the coating solutions in Examples 14 and 13, in which the Tb(thd)$_3$ wavelength converting agent and the EuFOD wavelength converting agent were mixed, respectively, as illustrated in FIGS. 10(*b*) and 10(*c*), it can be confirmed that the hydrogen-spectrum corresponding to polyorgano-silsesquioxane and the hydrogen spectrum corresponding to each wavelength converting agent appeared to be overlapped with each other (FIGS. 10(*b*) and (*c*)). In particular, it can be confirmed that an epoxy group of polyorgano-silsesquioxane corresponding to 2.5 to 4.0 ppm has a peak broadening phenomenon due to the interaction between the wavelength converting agents.

Photoluminescence Spectrum of Coating Solution

In order to confirm photoluminescence characteristics of a coating solution, the coating solution was placed into a 10 mm×10 mm quartz cell, and a photoluminescence spectrum analysis was performed using a photoluminescence spectrometer (model No. LS50B; Perkin Elmer, Inc.). The analysis results of the coating solutions in Examples 1 to 20 were illustrated in corresponding order in FIG. 3 (FIGS. 3(*a*) to 3(*f*), respectively). At this time, an excitation light source in a region of 350 to 480 nm was used as a light source. From these results, it can be confirmed that different light emission spectra are obtained depending on the light emission characteristics of the contained wavelength converting agent.

Transmittance of Coating Solution

In order to analyze the transmittance of a coating solution, the coating solution was placed into a 10 mm×10 mm quartz cell, and a transmission spectrum analysis was performed in a region of 500 to 700 nm using an UV-Vis spectrometer (model name, Cary 100; Varian, Inc.). The light transmittance result of the coating solution is illustrated in Table 1. The transmittance was expressed as a relative value based on a value of an aqueous solution (100% transmittance). Referring to Table 1, it can be confirmed that all the coating solutions according to Examples of the present invention have a transmittance of 90% or more in a visible light region of 500 to 700 nm. Representatively, a photograph of the transparent coating solution of Example 5 and a photograph of a transparent thin film forming a wavelength converting thin film from the coating solution of Example 5 according to Example 19 are illustrated in FIGS. 4(a) and 4(b), respectively.

2. Evaluation of Characteristics of Sheets

Scanning Electron Microscope Images of Sheets

SEM (Nova FE-SEM, 10 kV) images of the wavelength converting sheets formed according to Examples 21 to 23 are illustrated in FIGS. 6(a), 6(b), and 7, respectively.

Photoluminescence Characteristics of Sheets

Figure 9:
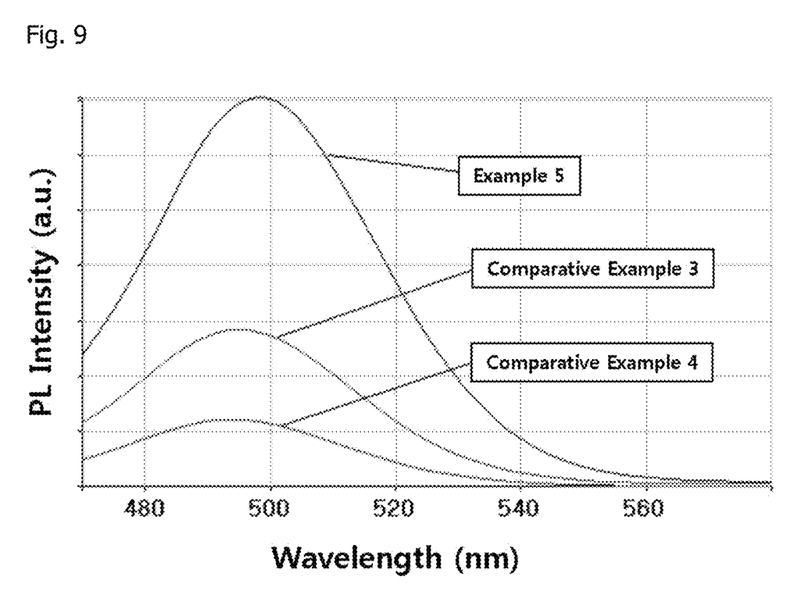
FIG. 9 is a result of photoluminescence spectra comparing a light emission between the wavelength converting sheet in Example 5 and the wavelength converting sheets prepared in Comparative Examples 3 and 4.

In order to measure photoluminescence characteristics of a wavelength converting sheet, a thin film formed on a glass substrate with a size of 1 cm×1 cm was placed into a solid sample holder of a photoluminescence spectrometer (Perkin Elmer, Inc., model name LS50B) to measure the photoluminescence spectrum. At this time, an excitation light source in a region of 350 to 480 nm was used as a light source. Representatively, FIG. 8 represents a comparison between photoluminescence characteristics of the wavelength converting sheets prepared from the coating solutions in Examples 9 and 16 and those of the sheets prepared by Comparative Examples 1 and 2, and FIG. 9 comparatively illustrates photoluminescence characteristics of the wavelength converting sheet prepared from the coating solution in Example 5, and the sheets in Comparative Examples 3 and 4.

Although the specific part of the present disclosure has been described in detail, it is obvious to those skilled in the art that such a specific description is just a preferred embodiment and the scope of the present invention is not limited thereby. Therefore, the substantial scope of the present disclosure will be defined by the appended claims and equivalents thereof.

What is claimed is:

1. A method for preparing a wavelength converting sheet, comprising the steps of:
(a) applying the following coating composition on a substrate,
wherein the coating composition comprises 1.0 to 60 wt % of polyorgano-silsesquioxane represented by the following Formula 1, 0.0001 to 30 wt % of a wavelength converting agent, and a solvent:

Formula 1 wherein in the Formula 1, $R_1$ and $R_2$ are independently selected from the group consisting of a $C_1$-$C_{10}$ straight chain or branched chain alkyl group, a vinyl group, a $C_6$-$C_{10}$ aryl group, a $C_7$-$C_{16}$ aralkyl group, a $C_7$-$C_{16}$ alkaryl group, a $C_3$-$C_{15}$ cycloalkyl group, a $C_4$-$C_{20}$ alkylcycloalkyl group, a methacrylate group, an acrylate group and an epoxy group, wherein the polyorgano-silsesquioxane has a number average molecular weight in a range of $10^2$ to $10^6$, and wherein the ratio of m to n is in a range of 6:4, and m and n are an integer of 1 to 10,000; and (b) curing the applied substrate; and
(c) applying a polyorgano-silsesquioxane protective layer.

2. The method of claim 1, wherein the substrate comprises plastic, stainless steel, aluminum, glass, quartz, a solar cell, an LED chip or a fiber.

3. The method of claim 1, wherein the sheet has a visible light transmittance of 70% or more compared to that of the air.

4. The method of claim 1, further comprising patterning a surface of the prepared sheet.

5. A wavelength converting sheet prepared according to the method of claim 1.

6. The sheet of claim 5, wherein the sheet is a patterned sheet and has at least two-fold higher photoluminescence intensity as compared to that of a non-patterned sheet.

7. A solar cell comprising the wavelength converting sheet of claim 5.

8. A method for preparing a solar cell, comprising the steps of: (a) preparing a solar cell; and (b) applying the wavelength converting sheet of claim 5 on at least one surface of the solar cell to form a wavelength converting layer.

* * * * *